US009640391B2

(12) United States Patent
Yang et al.

(10) Patent No.: US 9,640,391 B2
(45) Date of Patent: May 2, 2017

(54) DIRECT AND PRE-PATTERNED SYNTHESIS OF TWO-DIMENSIONAL HETEROSTRUCTURES

(71) Applicant: The Trustees of the Stevens Institute of Technology, Hoboken, NJ (US)

(72) Inventors: Eui-Hyeok Yang, Fort Lee, NJ (US); Kyung Nam Kang, Edgewater, NJ (US)

(73) Assignee: THE TRUSTEES OF THE STEVENS INSTITUTE OF TECHNOLOGY, Hoboken, NJ (US)

( * ) Notice: Subject to any disclaimer, the term of this patent is extended or adjusted under 35 U.S.C. 154(b) by 0 days.

(21) Appl. No.: 15/190,806

(22) Filed: Jun. 23, 2016

(65) Prior Publication Data
US 2016/0379822 A1 Dec. 29, 2016

Related U.S. Application Data

(60) Provisional application No. 62/183,331, filed on Jun. 23, 2015.

(51) Int. Cl.
*H01L 21/30* (2006.01)
*H01L 21/46* (2006.01)
(Continued)

(52) U.S. Cl.
CPC .... *H01L 21/02568* (2013.01); *H01L 21/0243* (2013.01); *H01L 21/0259* (2013.01);
(Continued)

(58) Field of Classification Search
CPC ......... H01L 21/30; H01L 21/00; H01L 21/76; H01L 21/03; H01L 21/02
(Continued)

(56) References Cited

U.S. PATENT DOCUMENTS

2007/0032089 A1* 2/2007 Nuzzo ................ B82Y 10/00
                                                        438/725
2008/0108171 A1* 5/2008 Rogers ................ B81C 1/0046
                                                        438/73
(Continued)

OTHER PUBLICATIONS

Han, et al., Seeded growth of highly crystalline molybdenum disulphide monolayers at controlled locations, Nature Communications (Sep. 2015).
(Continued)

*Primary Examiner* — Yuanda Zhang
*Assistant Examiner* — Sheikh Maruf
(74) *Attorney, Agent, or Firm* — Greenberg Traurig, LLP

(57) ABSTRACT

A method for growing a transition metal dichalcogenide on a substrate, the method including providing a growth substrate having a first side and a second side opposite the first side; providing a source substrate having a first side and a second side opposite the first side; depositing a transition metal oxide on at least a portion of the first side of the source substrate; combining the growth substrate with the source substrate such that the first side of the growth substrate contacts the transition metal oxide, the combining producing a substrate stack; exposing the substrate stack to a chalcogenide gas, whereby the transition metal oxide reacts with the chalcogenide gas to produce a layer of a transition metal dichalcogenide on at least a portion of the first side of the growth substrate; and removing the source substrate from the growth substrate having the layer of the transition metal dichalcogenide thereon.

20 Claims, 8 Drawing Sheets

(51) Int. Cl.
*H01L 21/02* (2006.01)
*H01L 21/762* (2006.01)
*H01L 21/3065* (2006.01)
*H01L 21/308* (2006.01)
*H01L 21/033* (2006.01)

(52) U.S. Cl.
CPC .. *H01L 21/02381* (2013.01); *H01L 21/02428* (2013.01); *H01L 21/02614* (2013.01); *H01L 21/02658* (2013.01); *H01L 21/0331* (2013.01); *H01L 21/0332* (2013.01); *H01L 21/3065* (2013.01); *H01L 21/3081* (2013.01); *H01L 21/3086* (2013.01); *H01L 21/76251* (2013.01)

(58) Field of Classification Search
USPC .... 438/455–458, 73, 725, 156; 257/29, 288, 257/750, 222, E21.214, E21.053, 257/E21.409, E23.16
See application file for complete search history.

(56) References Cited

U.S. PATENT DOCUMENTS

| | | | | |
|---|---|---|---|---|
| 2009/0166686 | A1* | 7/2009 | Hunt | B82Y 10/00 257/288 |
| 2013/0056873 | A1* | 3/2013 | Wada | H01L 23/5226 257/746 |
| 2013/0256629 | A1* | 10/2013 | Lee | H01L 27/283 257/13 |
| 2014/0251204 | A1* | 9/2014 | Najmaei | C30B 25/04 117/95 |
| 2015/0083206 | A1* | 3/2015 | Novoselov | B82Y 30/00 136/256 |
| 2015/0118487 | A1* | 4/2015 | Wolden | C03C 17/3464 428/336 |
| 2015/0303299 | A1* | 10/2015 | Chang | H01L 29/7827 257/29 |
| 2016/0181516 | A1* | 6/2016 | Reed | H01L 45/06 365/163 |
| 2016/0308006 | A1* | 10/2016 | Park | H01L 21/02381 |

OTHER PUBLICATIONS

Lee, et al., Atomically thin p-n junctions with van der Waals heterointerfaces. Nat. Nanotechnol., 9(9), pp. 676-681 (Jan. 2014).
Duan, et al., Lateral Epitaxial Growth of Two-Dimensional Layered Semiconductor Heterojunctions, Nature Nanotechnology, pp. 1-7 (Sep. 28, 2014).
Godin, et al., Increased Monolayer Domain Size and Patterned Growth of Tungsten Disulfide Through Controlling Surface Energy of Substrates, Journal of Physics D: Applied Physics, pp. 1-10 (Jul. 21, 2016).
Gong, et al., Vertical and In-Plane Heterostructures from WS2/MoS2 Monolayers, Nature Materials, vol. 13, pp. 1135-1142 (Dec. 2014).
Huang, et al., Lateral Heterojunctions within Monolayer MoSe2-WSe2 Semiconductors, Nature Materials, vol. 13, pp. 1096-1101 (Dec. 2014).
Kang, et al., The Growth Scale and Kinetics of WS2 Monolayers under Varying H2 Concentration, Scientific Reports, pp. 1-9 (Aug. 17, 2015).
Kang, et al., High-Mobility Three-Atom-Thick Semiconducting Films with Wafer-Scale Homogeneity, Nature, vol. 520, pp. 656-660 (Apr. 30, 2015).
Lan, et al., Large-Area Synthesis of Monolayer WS2 and its Ambient-Sensitive Photo-Detecting Performance, Nanoscale, vol. 7, pp. 5974-5980 (Mar. 6, 2015).
Lin, et al., Atomically Thin Heterostructures Based on Single-Layer Tungsten Diselenide and Graphene, American Chemical Society, Nano Letters, vol. 14, pp. 6936-6941 (Nov. 10, 2014).
Lin, et al., Direct Synthesis of van der Waals Solids, American Chemical Society, vol. 8, No. 4, pp. 3715-3723 (Mar. 18, 2014).
Zhang, et al., Controlled Growth of High-Quality Monolayer WS2 Layers on Sapphire and Imaging Its Grain Boundary, American Chemical Society, vol. 7, No. 10, pp. 8963-8971 (Sep. 18, 2013).

* cited by examiner

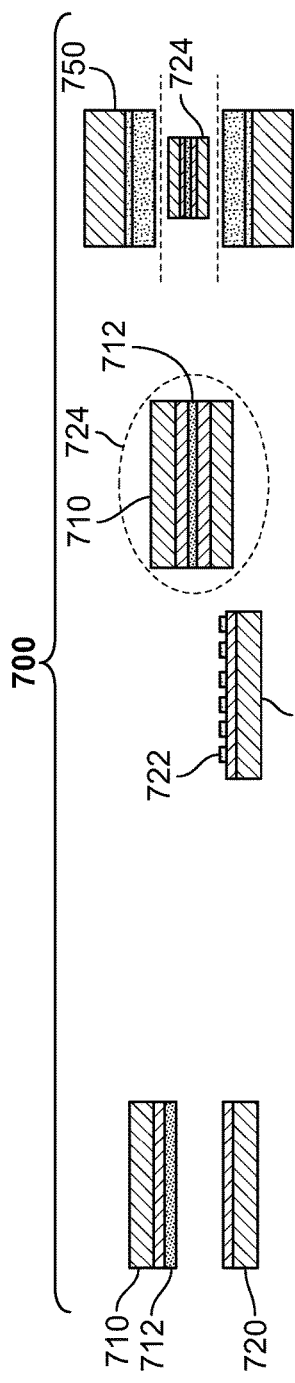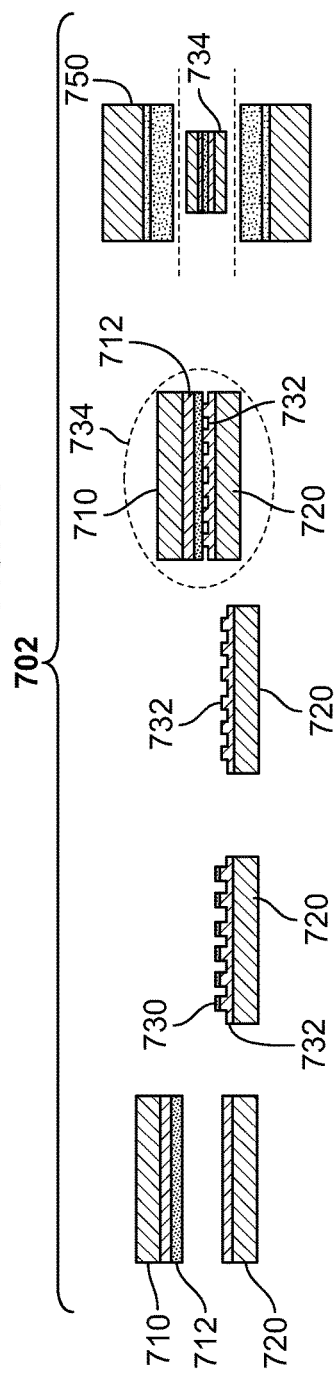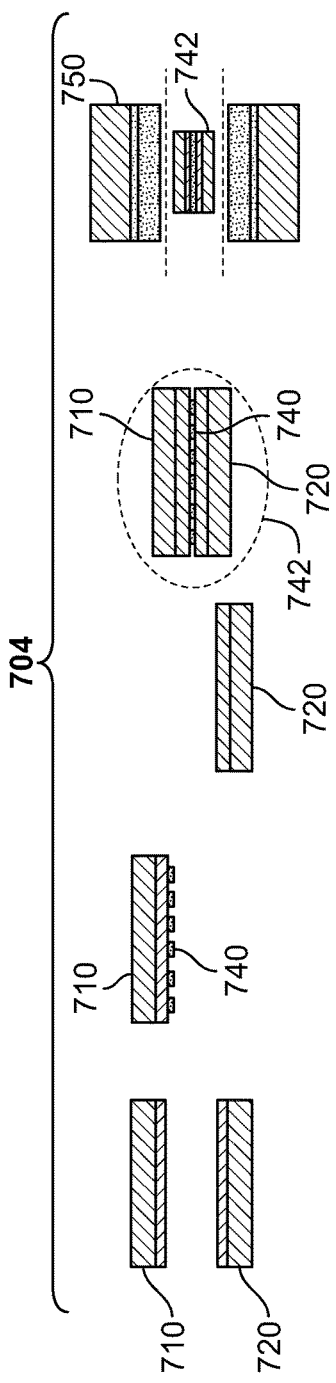

DIRECT AND PRE-PATTERNED SYNTHESIS OF TWO-DIMENSIONAL HETEROSTRUCTURES

CROSS-REFERENCE TO RELATED APPLICATION

This application is a Section 111(a) application relating to and claiming the benefit of commonly owned, co-pending U.S. Provisional Patent Application No. 62/183,331, titled "DIRECT AND PRE-PATTERNED SYNTHESIS OF TWO-DIMENSIONAL HETEROSTRUCTURES," having a filing date of Jun. 23, 2015, which is incorporated by reference herein in its entirety.

FIELD OF THE INVENTION

The exemplary embodiments relate generally to synthesis of two-dimensional ("2D") transition metal dichalcogenides ("TMDs") and, more specifically, to synthesis of TMDs using contact between a thin-film transition metal oxide deposited substrate and a growth substrate for growth.

BACKGROUND OF THE INVENTION

TMD monolayers are atomically thin semiconductors having direct bandgaps. These monolayers are useful for various types of semiconductors such as photodetectors, optical modulators, solar cells, light-emitting diodes ("LED"), flexible displays, transparent displays, etc. Although there are various useful applications for monolayer and heterostructure TMDs, current chemical vapor deposition methods cannot be used for the growth of large TMDs or over other TMD layers.

Typical current techniques for TMD heterostructure fabrication use a transfer process. According to such a process, each TMD monolayer is grown separately and one monolayer is taken off of the growth substrate and stacked on the other monolayer. However, this transfer process is time-consuming, requires alignment when one monolayer is stacked onto another (which is problematic for some optoelectronics applications), and involves the use of polymers which contaminate the interfaces of resulting TMD heterostructures. While techniques for direct growth of heterostructures exist, such techniques have limitations in terms of their achievable size of heterostructures. Furthermore, only bilayered heterostructures have been demonstrated because such techniques cannot add another layer atop bilayered heterostructures since the materials are either evaporated or damaged during the growth of a subsequent layer.

SUMMARY OF THE INVENTION

The exemplary embodiments relate to a "contact-growth method" for growth of large-area heterostructures as well as growth of TMD monolayers on patterned or unpatterned substrates. Large scale growth and large grain size TMD monolayer growth is essential for further application research. In addition to the large area growth, patterned growth and heterostructure synthesis of TMDs is important for various applications of TMD materials. The exemplary embodiments enable the direct epitaxial of TMD monolayers on other van der Waals materials (e.g., graphene or other TMDs) over a large area (e.g., on the order of over 100 microns), which can be extended to growth of TMD layers on patterned surfaces as well as growth of differing TMDs and other 2D materials on a same substrate.

In an embodiment, a method for growing a transition metal dichalcogenide on a substrate includes providing a growth substrate having a first side and a second side opposite the first side of the growth substrate; providing a source substrate having a first side and a second side opposite the first side of the source substrate; depositing a transition metal oxide on at least a portion of the first side of the source substrate; combining the growth substrate with the source substrate such that the first side of the growth substrate contacts the transition metal oxide, the combining producing a substrate stack; exposing the substrate stack to a chalcogenide gas, whereby the transition metal oxide reacts with the chalcogenide gas to produce a layer of a transition metal dichalcogenide on at least a portion of the first side of the growth substrate; and removing the source substrate from the growth substrate having the layer of the transition metal dichalcogenide thereon.

In an embodiment, the transition metal oxide is selected from the group consisting of molybdenum trioxide and tungsten trioxide. In an embodiment, the chalcogenide gas includes a chalcogen selected from the group consisting of sulfur and selenium. In an embodiment, each of the growth substrate and the source substrate includes silicon. In an embodiment, the first side of the growth substrate includes an oxidized silicon dioxide layer.

In an embodiment, the method also includes the step of forming a pattern on the first side of the growth substrate. The step of forming a pattern is performed between the steps of providing the growth substrate and of combining the growth substrate with the source substrate. The pattern is positioned such that, when the growth substrate is combined with the source substrate, only the pattern on the first side of the growth substrate contacts the transition metal oxide. During the exposing step, the transition metal oxide reacts with the chalcogenide gas to produce the layer of the transition metal dichalcogenide only on the pattern of the first side of the growth substrate.

In an embodiment, the step of forming the pattern on the first side of the growth substrate includes the steps of applying a shadow mask to the first side of the growth substrate to produce a masked growth substrate; exposing the masked growth substrate to oxygen plasma; and removing the shadow mask from the masked substrate to produce the growth substrate with the pattern formed on the first side of the growth substrate. In an embodiment, the shadow mask includes at least one of silicon and copper.

In an embodiment, the step of forming the pattern on the first side of the growth substrate includes the steps of applying a photoresist mask to the first side of the growth substrate to produce a masked growth substrate; etching the masked growth substrate by inductively-coupled plasma etching; and removing the photoresist mask from the masked substrate to produce the growth substrate with the pattern formed on the first side of the growth substrate. In an embodiment, the inductively-coupled plasma etching is performed using fluoroform plasma.

In an embodiment, the pattern is formed by depositing graphene on a portion of the first side of the growth substrate to produce the growth substrate with the pattern formed on the first side of the growth substrate.

In an embodiment, the step of depositing a transition metal oxide on at least a portion of the first side of the source substrate includes the step of forming a pattern of the transition metal oxide on a portion of the first side of the source substrate. The pattern of transition metal oxide on the portion of the first side of the source substrate corresponds to a target area of the first side of the growth substrate. When the substrate stack is exposed to the chalcogenide gas, the pattern of transition metal oxide reacts with the chalcogenide gas to produce the layer of the transition metal dichalcogenide on the target area of the first side of the growth substrate. In an embodiment, the step of forming the pattern of the transition metal oxide on the portion of the first side of the source substrate includes the steps of applying a lift-off mask to the first side of the source substrate to produce a masked source substrate; exposing the masked source substrate to an evaporated transition metal oxide; and removing the lift-off mask from the masked source substrate to produce the pattern of transition metal oxide on the portion of the first side of the source substrate.

In an embodiment, the method also includes exposing the growth substrate to oxygen plasma. The step of exposing the growth substrate to oxygen plasma is performed after the step of combining the growth substrate with the source substrate and is performed before the step of exposing the substrate stack to the chalcogenide gas. In an embodiment, when the growth substrate is provided, the growth substrate includes a further layer of a transition metal dichalcogenide on a further portion of the first side of the growth substrate. In an embodiment, the at least a portion of the first side of the growth substrate intersects the further portion of the first side of the growth substrate.

In an embodiment, the step of exposing the substrate stack to the chalcogenide gas includes the steps of providing a chalcogenide powder having an evaporation temperature, and heating the chalcogenide powder to the evaporation temperature to produce the chalcogenide gas. In an embodiment, the step of exposing the substrate stack to chalcogenide gas includes the steps of providing a furnace, the furnace having an upstream location and a downstream location; placing the chalcogenide powder at the upstream location of the furnace; placing the substrate stack at the downstream location of the furnace; and heating the furnace to the evaporation temperature of the chalcogenide powder, whereby the chalcogenide powder evaporates to produce the chalcogenide gas, and whereby the furnace causes the chalcogenide gas to flow from the upstream location to the downstream location to expose the substrate stack to the chalcogenide gas.

In an embodiment, the method also includes depositing a further transition metal oxide on a further portion of the first side of the source substrate. The step of depositing the further transition metal oxide is performed between the steps of depositing the transition metal oxide on the at least a portion of the first side of the source substrate and of combining the growth substrate with the source substrate. When the substrate stack is exposed to the chalcogenide gas, the further transition metal oxide reacts with the chalcogenide gas to produce a layer of a further transition metal dichalcogenide on a further portion of the growth substrate. In an embodiment, the layer of the transition metal dichalcogenide is a monolayer.

BRIEF DESCRIPTION OF FIGURES

FIG. 7A illustrates the process of FIG. 6 as applied to the growth of a patterned substrate, the pattern being formed through the application of plasma to a growth substrate through a shadow mask;

FIG. 7B illustrates the process of FIG. 6 as applied to the growth of a patterned substrate, the pattern being formed through inductively coupled plasma etching of a growth substrate using a photoresist mask;

FIG. 7C illustrates the process of FIG. 6 as applied to the growth of a patterned substrate, the pattern being formed through liftoff patterning of a transition metal oxide on a source substrate;

DETAILED DESCRIPTION OF THE INVENTION

The exemplary embodiments relate to contact-growth techniques for growth of transition metal dichalcogenides ("TMDs") in various manners. In an embodiment, TMDs are deposited over a large target area. In an embodiment, TMDs are grown on a patterned substrate.

Figure 1:
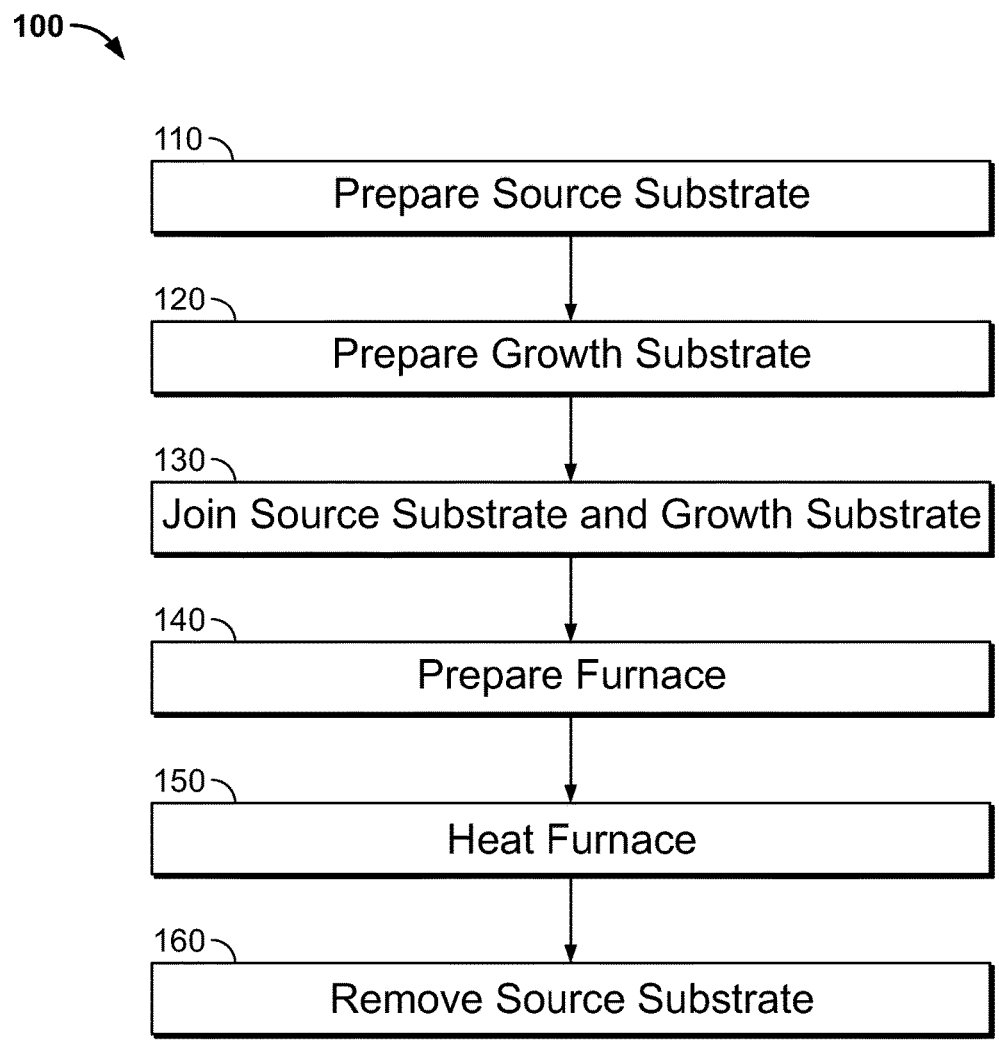
FIG. 1 illustrates a flow chart of a method for deposition of TMDs onto a target substrate.

FIG. 1 shows an exemplary method 100 for deposition of a TMD onto a substrate. In step 110 of the method 100, a source substrate is prepared. This step may be accomplished by depositing a thin film of a transition metal oxide onto one side of a substrate. In an embodiment, the transition metal oxide includes molybdenum trioxide ($MoO_3$). In an embodiment, the transition metal oxide includes tungsten trioxide ($WO_3$). In an embodiment, deposition may be performed with an e-beam evaporator.

In step 120 of the method 100, a growth substrate is prepared. In an embodiment, a clean substrate may be prepared for use in large area TMD growth. For oxygen plasma assisted growth, a growth substrate is exposed to plasma directly before growth. Pre-growth oxygen plasma treatment may increase the crystal size of grown monolayer tungsten disulfide ($WS_2$). For example, a growth process performed on an untreated substrate results in a nucleation density of 940±15 crystals/mm$^2$ and an average $WS_2$ crystal size of 56±1 μm$^2$. With plasma treatment, the nucleation density decreases by 8% to 871±11 crystals/mm$^2$ while the average $WS_2$ crystal sized increases by 78% to 101±2 μm$^2$. To produce patterned growth, a contact shadow mask is used during the plasma treatment process; the mask is removed before growth, leaving only the surface energy difference to do the patterning. Another growth is run with process parameters optimized for selectivity between the plasma treated and untreated regions.

In an embodiment, a patterned substrate may be prepared for patterned TMD growth; in such an embodiment, preparation of the substrate may include etching a desired pattern on the substrate via a conventional lithography or dry-etching process. In an embodiment, a TMD pre-grown substrate may be prepared for TMD heterostructure synthesis.

In step 130, the source substrate and growth substrate, as prepared in steps 110 and 120, respectively, are stacked with one another. In this step, the side of the source substrate having the transition metal oxide deposited thereon is brought into contact with the target portion (e.g., the pattern of a patterned substrate to be used for patterned TMD growth; the TMD predeposit of a substrate to be used for TMD heterostructure synthesis) of the growth substrate.

In step 140, a furnace is prepared for use in TMD formation. In an embodiment, the furnace is a laboratory tube furnace. In an embodiment, the furnace is an OTF-1200X furnace manufactured by MTI Corporation of Richmond, Calif. However, it will be apparent to those of skill in the art that alternative embodiments may use any type of heat source capable of applying heat as described herein. In this step, a chalcogenide in powder form is placed into a furnace tube upstream of an intended reaction area. In an embodiment, the chalcogenide includes sulfur. In an embodiment, the chalcogenide includes selenium. The stacked substrate formed in the third step is placed in the middle of the furnace tube and a vacuum is generated in the furnace tube.

In step 150, the furnace tube is heated to evaporate the chalcogenide powder. In an embodiment, the furnace tube is heated to 900° C. The evaporation of the chalcogenide powder produces chalcogenide gas. The chalcogenide gas reacts with the transition metal oxide, resulting in the formation of a new TMD monolayer on the growth substrate. In an embodiment wherein the transition metal oxide includes molybdenum trioxide and the chalcogenide includes sulfur, the TMD monolayer includes molybdenum disulfide ($MoS_2$). In an embodiment wherein the transition metal oxide includes molybdenum trioxide and the chalcogenide includes selenium, the TMD monolayer includes molybdenum diselenide ($MoSe_2$). In an embodiment wherein the transition metal oxide includes tungsten trioxide and the chalcogenide includes sulfur, the TMD monolayer includes tungsten disulfide ($WS_2$). In an embodiment, wherein the transition metal oxide includes tungsten trioxide and the chalcogenide includes selenium, the TMD monolayer includes tungsten diselenide ($WSe_2$). In an embodiment, the TMD monolayer may be appropriate for use in a p-type semiconductor. In an embodiment, the TMD monolayer may be appropriate for use in an n-type semiconductor.

In step 160, the source substrate is removed from the growth substrate with the TMD monolayer formed thereon. More particularly, following the formation of the TMD monolayer, as described above, the source substrate does not adhere to the growth substrate with the TMD monolayer formed thereon. Therefore, the source substrate may easily be removed therefrom.

In the method 100, the growth and source substrates may be of any size that may be accommodated in the furnace used for the reaction; thus, TMDs may be grown over a large target area. Additionally, because the target substrate may be patterned in any desired manner, TMD growth may be targeted to the patterned area. Further, because an existing TMD deposit may exist on the growth substrate, a further TMD monolayer may be added to the existing TMD deposit without requiring any transfer of one or more TMD layers to be performed.

Figure 2:
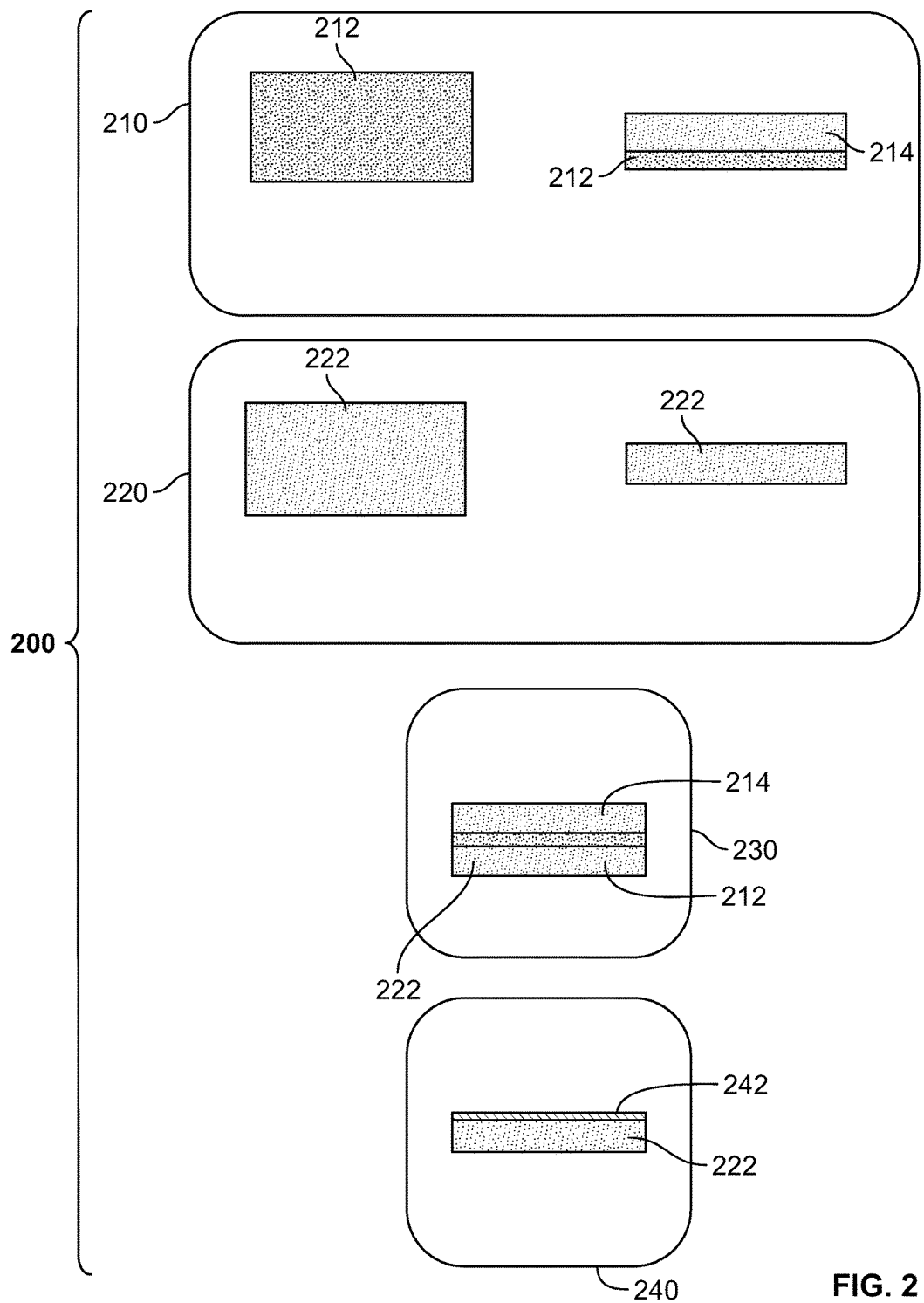
FIG. 2 illustrates the elements involved in performance of the method of FIG. 1 to deposit a TMD onto a plain substrate at various stages of the method of FIG. 1.

FIG. 2 illustrates the elements existing at various stages of the performance of the method of FIG. 1 when a TMD is grown on a plain substrate. At a first stage 210, a thin film 212 of a transition metal oxide (e.g., $MoO_3$, $WO_3$, etc.) is coated on a source substrate 214, which is shown both from the top and from the side. At a second stage 220, a plain (e.g., not patterned) growth substrate 222 is provided; the growth substrate 222 is also shown from the top and from the side. At a third stage 230, shown from the side, the source and growth substrates are placed together such that the transition metal oxide thin film 212 is sandwiched between the source substrate 214 and the growth substrate 222. The sandwiched combination of substrates is processed using an oven, as described above with reference to steps 140 and 150 of the method 100. Once processed, in a final stage 240, also shown from the side, a TMD monolayer 242 (e.g., $MoSe_2$, $WS_2$, etc.) remains on the growth substrate 222 after the source substrate 214 has been removed therefrom.

Figure 3:
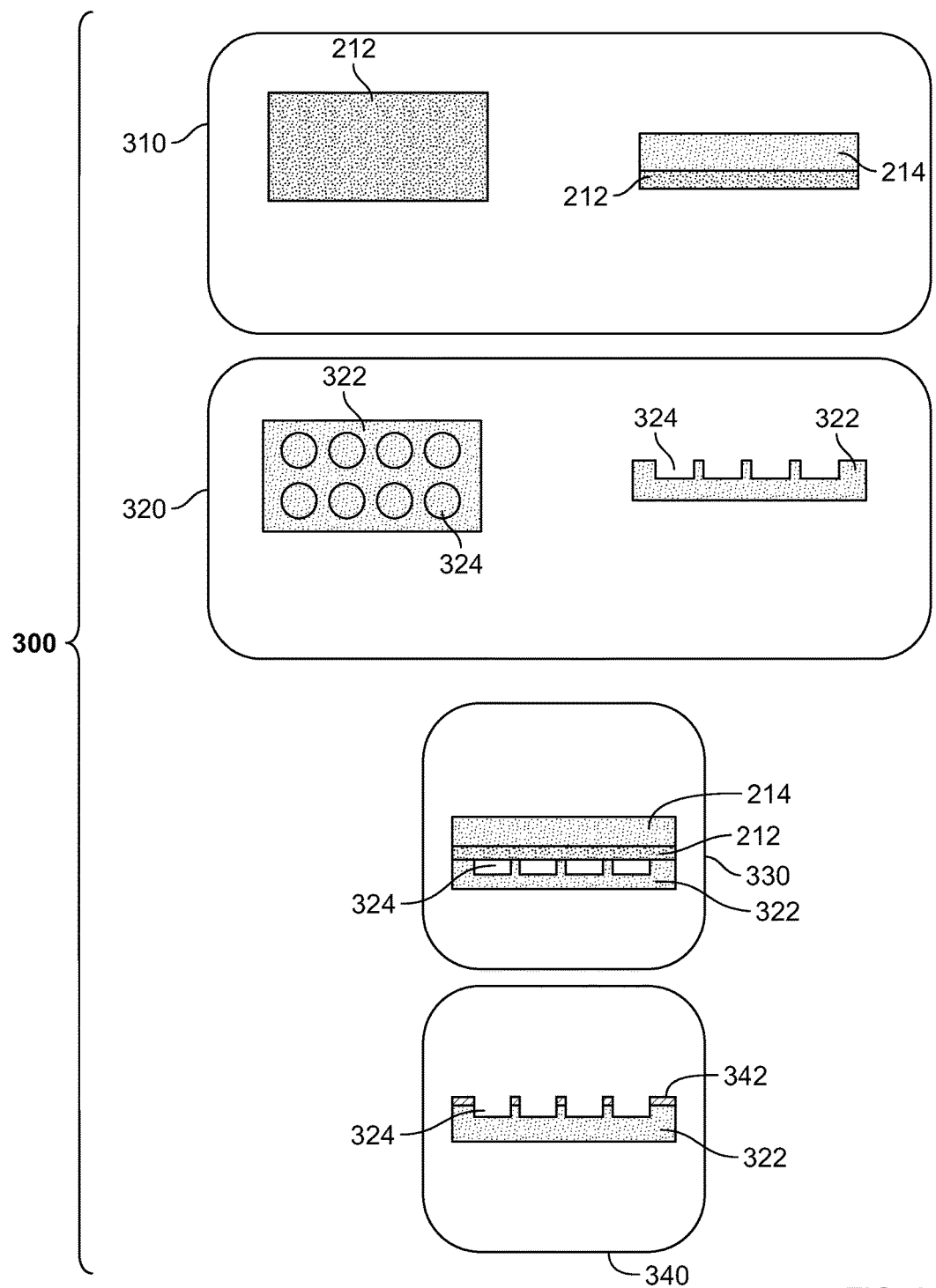
FIG. 3 illustrates the elements involved in performance of the method of FIG. 1 to deposit a TMD onto a patterned substrate at various stages of the method of FIG. 1.

FIG. 3 illustrates the elements existing at various stages of the performance of the method of FIG. 1 when a TMD is grown on a patterned substrate. At a first stage 310, a thin film 212 of a transition metal oxide (e.g., $MoO_3$, $WO_3$, etc.) is coated on a source substrate 214, which is shown both from the top and from the side, and which is identical to the source substrate 214 described above with reference to FIG. 2. At a second stage 320, a growth substrate 322 having a pattern 324 formed therein is provided; the growth substrate 322 is also shown from the top and from the side. At a third stage 330, shown from the side, the source and growth substrates are placed together such that the transition metal oxide thin film 212 is sandwiched between the source substrate 214 and the growth substrate 322. The sandwiched combination of substrates is processed using an oven, as described above with reference to steps 140 and 150 of the method 100. Once processed, in a final stage 340, also shown from the side, a patterned TMD monolayer 342 (e.g., $MoSe_2$, $WS_2$, etc.) remains on the growth substrate 322 after the source substrate 214 has been removed therefrom.

Figure 4:
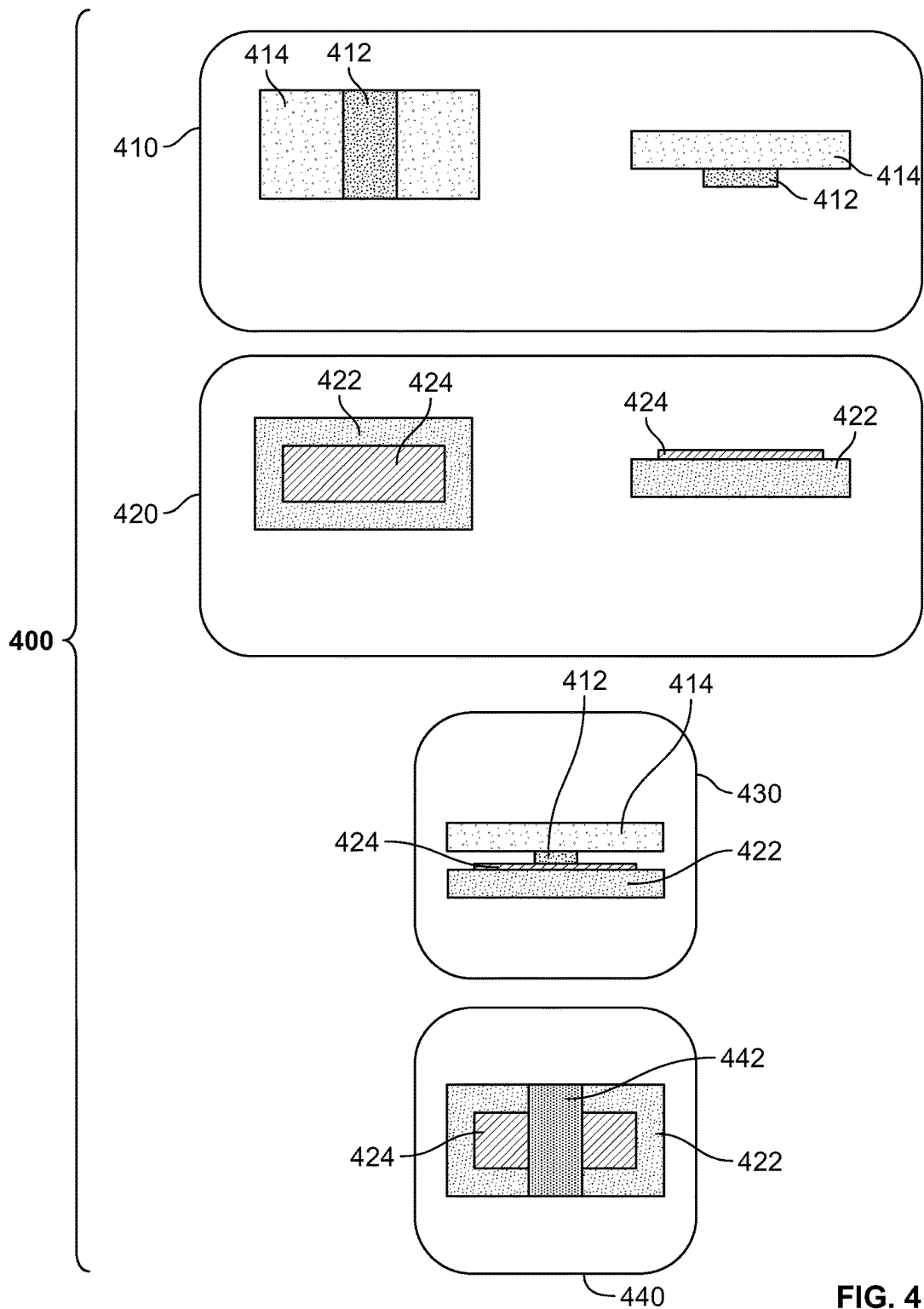
FIG. 4 illustrates the elements involved in performance of the method of FIG. 1 to deposit a TMD onto a substrate having a previously deposited TMD thereon at various stages of the method of FIG. 1.

FIG. 4 illustrates the elements existing at various stages of the performance of the method of FIG. 1 when a TMD is grown on a substrate that has a previously—deposited TMD layer thereon. At a first stage 410, a thin film 412 of a transition metal oxide (e.g., $MoO_3$, $WO_3$, etc.) is coated on a desired portion of a source substrate 414, which is shown both from the top and from the side. At a second stage 420, a growth substrate 422 having a TMD layer 424 deposited thereon is provided; the growth substrate 422 is also shown from the top and from the side. At a third stage 430, shown from the side, the source and growth substrates are placed together such that the transition metal oxide thin film 412 and the TMD layer 424 are sandwiched between the source substrate 414 and the growth substrate 422. The sandwiched combination of substrates is processed using an oven, as described above with reference to steps 140 and 150 of the method 100. Once processed, in a final stage 440, also shown from the side, a patterned TMD monolayer 442 (e.g., $MoSe_2$, $WS_2$, etc.) remains on the growth substrate 422 and overlays the TMD layer 424 after the source substrate 414 has been removed therefrom.

Figure 5:
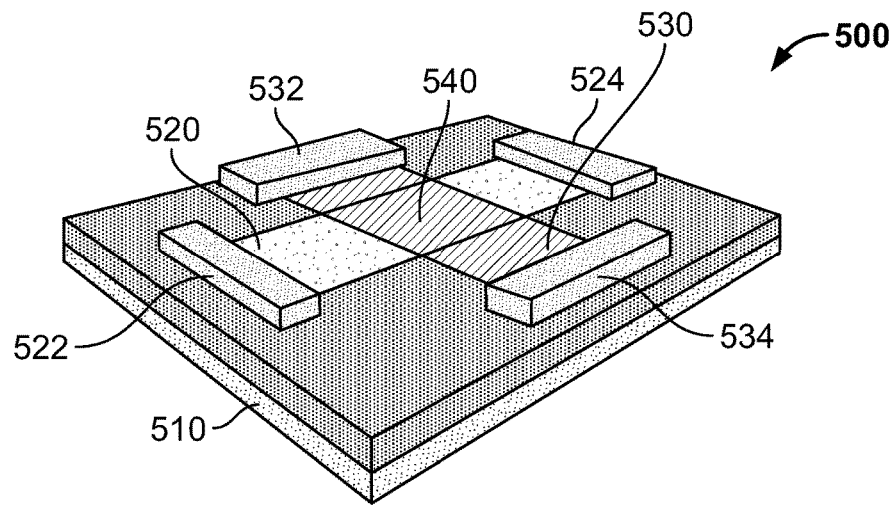
FIG. 5 illustrates a P-N junction device fabricated according to the method of FIG. 1.

FIG. 5 illustrates a P-N junction device 500 fabricated in accordance with the process described above with reference to FIG. 4. A silicon dioxide ($SiO_2$) substrate 510 has a first TMD layer 520 (e.g., a layer of $WSe_2$) grown thereon and extending between two palladium terminals 522, 524. A second TMD layer 530 (e.g., a layer of MoS$_2$) is subsequently grown thereon and extends between two aluminum terminals 532, 534. A P-N junction area 540 is formed at the intersection of the first and second TMD layers 520, 530.

Figure 6:
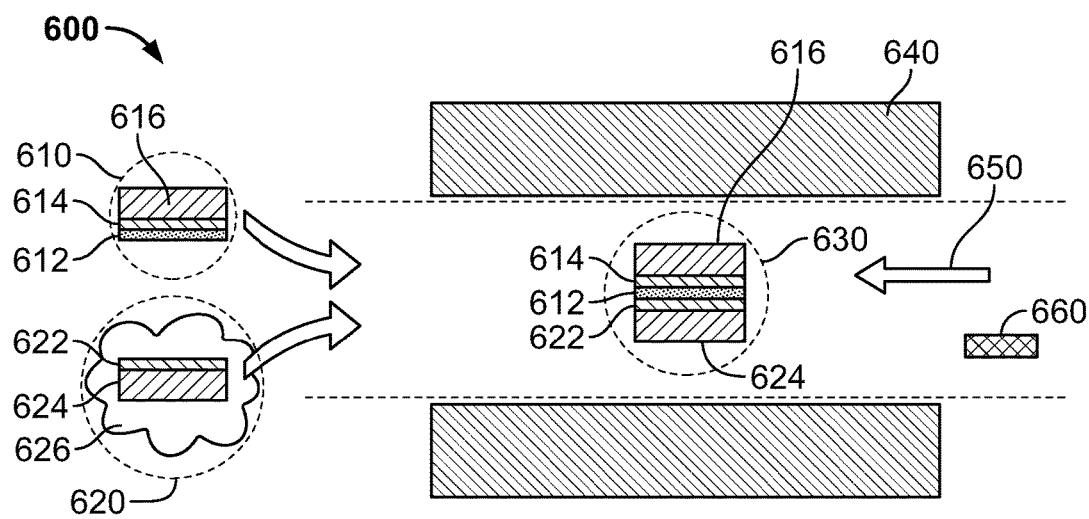
FIG. 6 illustrates a process for surface treatment and contact between source and target substrates to promote the growth of TMDs over a large target area.

FIG. 6 illustrates a process 600 for preparing and joining substrates to grow a TMD layer over a large target area. A prepared source substrate 610 includes a layer 612 of a transition metal oxide (e.g., WO$_3$) deposited on a silicon substrate 616 having an oxidized silicon dioxide surface 614. A prepared growth substrate 620 includes an oxidized silicon dioxide surface 622 of a silicon substrate 624. The growth substrate 620 is exposed to oxygen plasma 626 directly before growth, which leads to increased crystal size as described above. The prepared source substrate 610 and prepared growth substrate 620 may be combined into a sandwich 630, which may then be placed into a furnace 640 as described above. A chalcogenide powder 660 (e.g., sulfur, selenium) form is placed into a furnace tube upstream of an intended reaction area, and may be induced to flow through the furnace 640 by a flow of gas (e.g., argon and/or hydrogen). As described above, as a result of the process 600, a TMD is grown on the growth substrate 620.

FIGS. 7A-7C illustrate processes for patterned TMD growth. In the process 700 shown in FIG. 7A, a source substrate 710 with a transition metal oxide layer 712 is provided. A growth substrate 720 is also provided. The growth substrate 720 is treated with oxygen plasma through a shadow mask (e.g., made from both polished silicon and rolled copper foils), resulting in a pattern 722 being formed on the growth substrate 720. The source substrate 710 and the treated growth substrate 720 are combined to form a sandwich 724. The sandwich 724 is then processed using a furnace 750, as described above, to form a patterned TMD layer on the growth substrate 720.

In the process 702 shown in FIG. 7B, a source substrate 710 with a transition metal oxide layer 712 is provided. A growth substrate 720 is also provided. A photoresist mask 730 is applied to the growth substrate 720 and a pattern 732 is etched using inductively-coupled plasma ("ICP") etching through the use of CHF$_3$ plasma. The photoresist mask 730 is then removed using acetone (e.g., 55 nm deep in a 90 nm oxide). The source substrate 710 and the etched growth substrate 720 are combined to form a sandwich 734, which is subjected to a pre-growth oxygen plasma treatment. The sandwich 734 is then processed using a furnace 750, as described above, to form a patterned TMD layer on the growth substrate 720.

In the process 704 shown in FIG. 7C, a source substrate 710 with a transition metal oxide layer 712 is provided. A growth substrate 720 is also provided. A pattern 740 is formed in the transition metal oxide layer 712 using liftoff and electron beam evaporation of 50 nm WO$_3$ from pellets. The patterned source substrate 720 and the growth substrate 720 are combined to form a sandwich 742, which is subjected to a pre-growth oxygen plasma treatment. The sandwich 742 is then processed using a furnace 750, as described above, to form a patterned TMD layer on the growth substrate 720.

Figure 8:
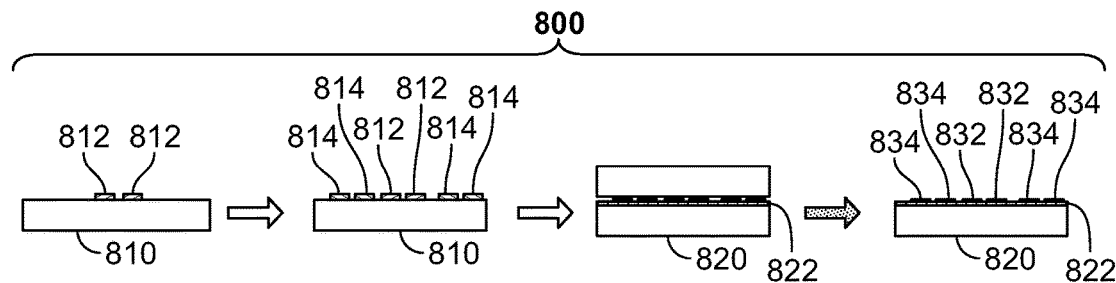
FIG. 8 illustrates a process for growth of different prepatterned TMDs on a same substrate.

FIG. 8 illustrates a process 800 for the growth of disparate pre-patterned TMD layers on a same substrate. In a first stage of the process, a pre-patterned thin film 812 of a first transition metal oxide (e.g., MoO3) is coated onto a substrate 810 (e.g., a silicon substrate). In a second stage of the process, a pre-patterned thin film 814 of a second transition metal oxide (e.g., WO$_3$) is coated onto the substrate 810. In a third stage of the process, the patterned substrate 810 is sandwiched with a growth substrate (e.g., a silicon substrate 820 with a silicon dioxide layer 822 thereon). The sandwiched substrates are processed using an oven, as described above with reference to steps 140 and 150 of the method 100. As a result, two differently patterned TMD layers 832 (e.g., a MoS$_2$ layer) and 834 (e.g., a WS$_2$ layer) are grown on the substrate 820.

Figure 9:
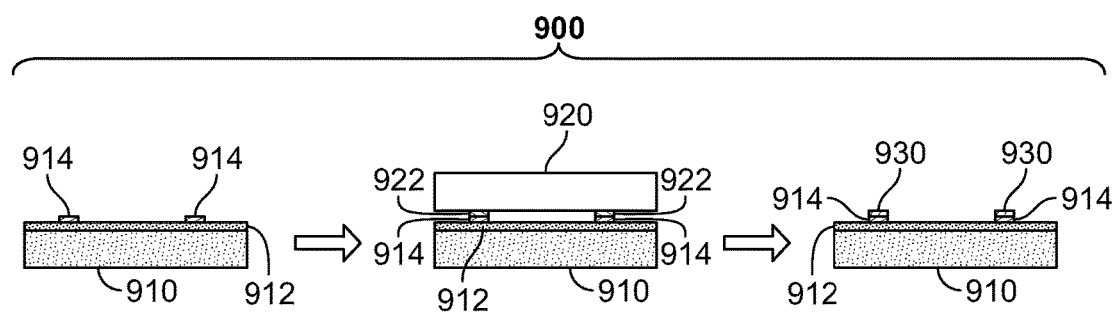
FIG. 9 illustrates a process for growth of TMDs over a large target area on graphene oxide.

FIG. 9 illustrates a process 900 for the growth of TMD layers on graphene. In a first stage of the process, a growth substrate (e.g., a silicon substrate 910 with a silicon dioxide layer 912) with patterned graphene 914 thereon is provided. In a second stage of the process, a source substrate 920 having a transition metal oxide 922 (e.g., WO$_3$) patterned thereon is provided, and the substrates 910 and 920 are sandwiched together as described above. The substrates are processed using an oven, as described above with reference to steps 140 and 150 of the method 100. As a result, the substrate 910 has a patterned TMD layer 930 deposited on the patterned graphene 914.

Figure 10:
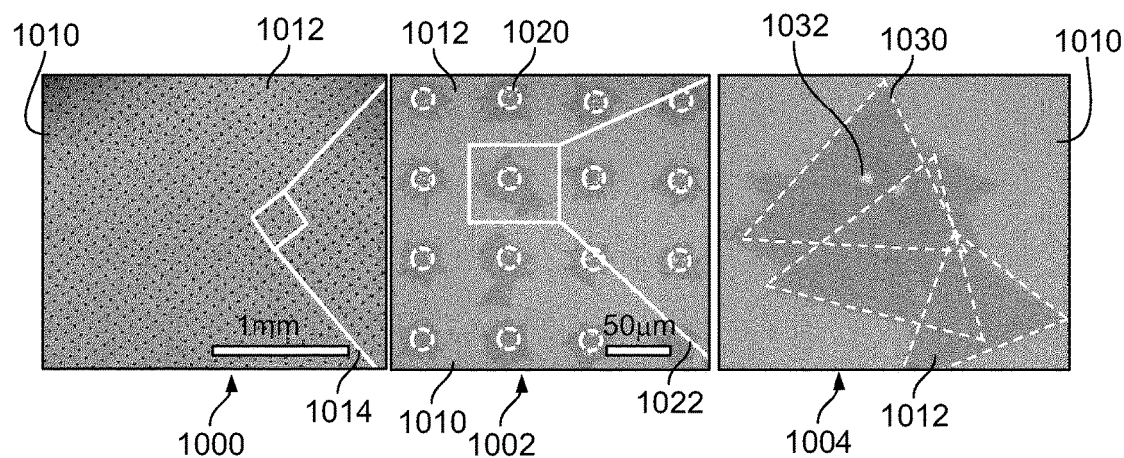
FIG. 10 shows a sequence of photographs, at progressively increasing magnification levels, of bi-layered TMDs grown on a substrate.

FIG. 10 illustrates sequentially magnified photographs 1000, 1002, 1004 showing bi-layered TMDs deposited on a substrate. In the photograph 1000, a substrate 1010 (e.g., an oxidized silicon wafer) is shown having an array of locally grown TMDs 1012 thereon. The photograph 1000 includes a magnification indicator 1014 indicating the portion of the photograph 1000 that is shown in the magnified photograph 1002. In the photograph 1002, the substrate 1010 is shown in greater detail. The locally grown TMDs 1012 can be seen more clearly. The photograph 1002 includes an array of circles 1020, which outline the locations of patterned transition metal (e.g., MoO$_3$, WO$_3$, etc.) applied to the substrate 1010 to produce the TMDs 1012. In an embodiment, the patterned transition metal may be applied to the substrate through the use of a patterned photoresist layer. The photograph 1002 includes a magnification indicator 1022 indicating the portion of the photograph 1002 that is shown in the further-magnified photograph 1004. The photograph 1004 shows, in greater detail, the locally grown TMDs 1012. The photograph 1004 includes triangles 1030, which indicate the borders of single crystalline monolayer islands. The photograph 1004 also shows bi-layered TMDs 1032, which are grown on top of monolayered TMDs.

In an embodiment, TMD growth as described above may be performed during the fabrication of field effect transistors ("FET"). In an embodiment, TMD deposition as described above may be performed during the fabrication of optoelectronic devices. TMD monolayers are direct band gap semiconductors, which makes them react strongly with light. TMD monolayers also have high absorption coefficients and efficient electron-hole pair generation. These properties suggest TMDs are good candidates for photodetectors and optical modulators. Furthermore, the direct band gap of TMD is useful in the fabrication of light emitting diodes ("LEDs").

In an embodiment, TMD growth as described above may be performed during the fabrication of flexible and stretchable electronic components for use in wearable devices. TMD monolayers are atomically thin (e.g., on the order of about 1 nanometer) and have a failure strain of 11% to 25%. The thinness of TMDs makes them flexible out of plane. The combination of desirable mechanical properties (e.g., capability to be flexed and stretched) and electrical properties make TMD monolayers a useful material for wearable devices.

In an embodiment, TMD growth as described above may be performed during the fabrication of solar cells. TMD monolayers can absorb 5% to 10% of incident light despite their thinness, which is more than double the absorption rate of graphene. The high absorption rate, efficient electron-hole generation, fast relaxation time, and type II energy band alignment of TMD heterostructures make them a good material for solar cells. The generated power per unit volume of a solar cell using TMD heterostructures may be higher by a factor of about 10 than that of a gallium arsenide solar cell.

The exemplary embodiments for contact growth of TMDs enable fabrication of heterostructures, facilitating "anti-degradation." For example, the exemplary embodiments may provide for anti-oxidation of $WS_2$ on graphene. Suspended $WS_2$/graphene does not exhibit oxidation in ambient air, which may be attributed to a lack of defects and local electric-fields. Oxidation of $WS_2$ occurs at localized areas containing defects, such as edges or grain boundaries, and oxidation of the interior of the perfect single crystalline $WS_2$ occurs due to the rough surface of the $SiO_2$ substrate. However, no oxidation occurs in the interior of $WS_2$ when it is grown on graphene because graphene screens the existing defects of the $SiO_2$ substrate, diminishing potential initiation sites for oxidation.

Figure 11:
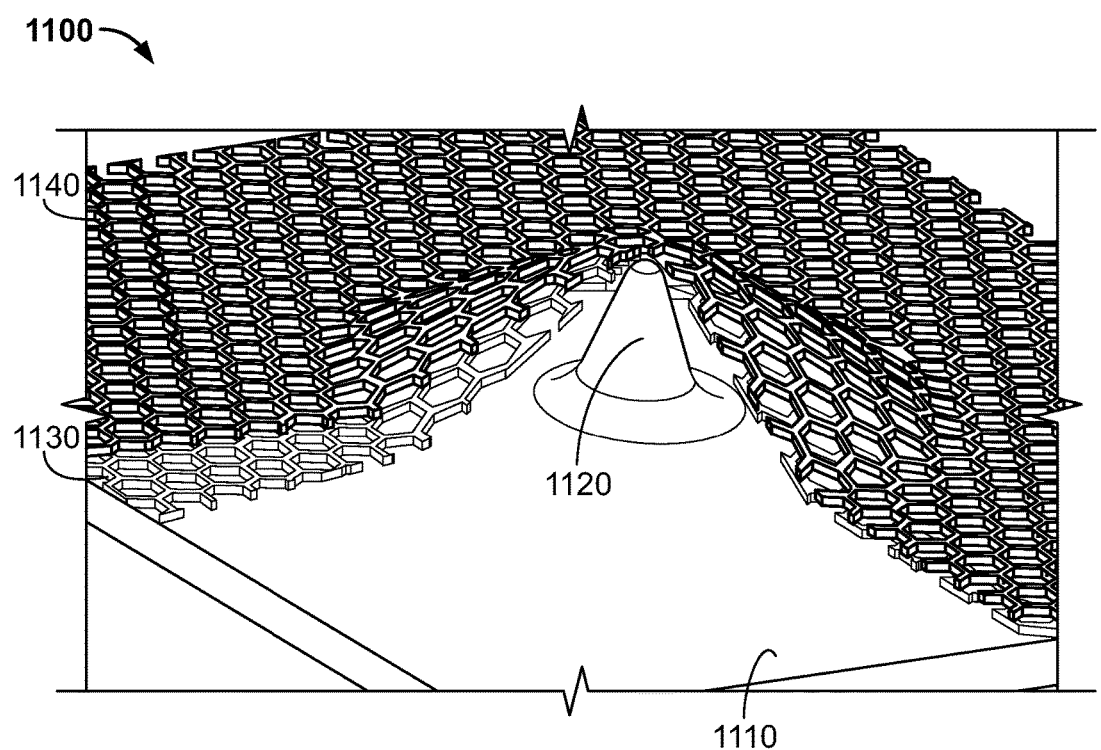
FIG. 11 illustrates the anti-oxidation properties of a substrate having graphene and a tungsten sulfide monolayer grown thereon.

FIG. 11 is an image 1100 of a substrate 1110 having a spike 1120 protruding therefrom; it will be apparent to those of skill in the art that such spikes may commonly be found on substrates having an oxidized silicon surface. If a TMD is grown on such a surface, in accordance with the processes described above, the TMD microlayer may be non-uniform, which may lead to oxidation. Additionally, spikes such as the spike 1120 may lead to the induction of local electric fields, which may also lead to oxidation. However, in FIG. 11, a graphene layer 1130 has been deposited onto the substrate 1110 prior to TMD growth. The presence of the graphene layer 1130 covers the spike 1120, thereby smoothing the surface of the substrate 1110 prior to TMD growth and reducing the effect of electric fields. A TMD layer 1140 has been grown atop the graphene layer 1130 as described above with reference to FIG. 9. Due to the presence of the graphene layer 1130 on the substrate and below the TMD layer 1140, oxidation of the TMD layer 1140 may be extremely slow or even non-existent.

It should be understood that the embodiments described herein are merely exemplary in nature and that a person skilled in the art may make many variations and modifications thereto without departing from the scope of the present invention. All such variations and modifications, including those discussed above, are intended to be included within the scope of the invention exemplified in the attached claims.

The invention claimed is:

1. A method for growing a transition metal dichalcogenide on a substrate, the method comprising:
   providing a growth substrate having a first side and a second side opposite said first side of said growth substrate;
   providing a source substrate having a first side and a second side opposite said first side of said source substrate;
   depositing a transition metal oxide on at least a portion of said first side of said source substrate;
   combining said growth substrate with said source substrate such that said first side of said growth substrate contacts said transition metal oxide, said combining producing a substrate stack;
   exposing said substrate stack to a chalcogenide gas, whereby said transition metal oxide reacts with said chalcogenide gas to produce a layer of a transition metal dichalcogenide on at least a portion of said first side of said growth substrate; and
   removing said source substrate from said growth substrate having said layer of said transition metal dichalcogenide thereon.

2. The method of claim 1, wherein said transition metal oxide is selected from the group consisting of molybdenum trioxide and tungsten trioxide.

3. The method of claim 1, wherein said chalcogenide gas includes a chalcogen selected from the group consisting of sulfur and selenium.

4. The method of claim 1, wherein each of said growth substrate and said source substrate includes silicon.

5. The method of claim 4, wherein said first side of said growth substrate includes an oxidized silicon dioxide layer.

6. The method of claim 1, further comprising the step of:
   forming a pattern on said first side of said growth substrate, said step of forming a pattern being performed between said steps of providing said growth substrate and of combining said growth substrate with said source substrate, said pattern being positioned such that, when said growth substrate is combined with said source substrate, only said pattern on said first side of said growth substrate contacts said transition metal oxide,
   wherein, during said exposing step, said transition metal oxide reacts with said chalcogenide gas to produce said layer of said transition metal dichalcogenide only on said pattern of said first side of said growth substrate.

7. The method of claim 6, wherein said step of forming said pattern on said first side of said growth substrate includes the steps of:
   applying a shadow mask to said first side of said growth substrate to produce a masked growth substrate;
   exposing said masked growth substrate to oxygen plasma; and
   removing said shadow mask from said masked substrate to produce said growth substrate with said pattern formed on said first side of said growth substrate.

8. The method of claim 7, wherein said shadow mask includes at least one of silicon and copper.

9. The method of claim 6, wherein said step of forming said pattern on said first side of said growth substrate includes the steps of:
   applying a photoresist mask to said first side of said growth substrate to produce a masked growth substrate;
   etching said masked growth substrate by inductively-coupled plasma etching; and
   removing said photoresist mask from said masked substrate to produce said growth substrate with said pattern formed on said first side of said growth substrate.

10. The method of claim 9, wherein said inductively-coupled plasma etching is performed using fluoroform plasma.

11. The method of claim 6, wherein said pattern is formed by depositing graphene on a portion of said first side of said growth substrate to produce said growth substrate with said pattern formed on said first side of said growth substrate.

12. The method of claim 1, wherein said step of depositing a transition metal oxide on at least a portion of said first side of said source substrate comprises the step of:
   forming a pattern of said transition metal oxide on a portion of said first side of said source substrate, said pattern of transition metal oxide on said portion of said first side of said source substrate corresponding to a target area of said first side of said growth substrate,
   wherein, when said substrate stack is exposed to said chalcogenide gas, said pattern of transition metal oxide reacts with said chalcogenide gas to produce said layer of said transition metal dichalcogenide on said target area of said first side of said growth substrate.

13. The method of claim 12, wherein said step of forming said pattern of said transition metal oxide on said portion of said first side of said source substrate comprises the steps of:
   applying a lift-off mask to said first side of said source substrate to produce a masked source substrate;
   exposing said masked source substrate to an evaporated transition metal oxide; and
   removing said lift-off mask from said masked source substrate to produce said pattern of transition metal oxide on said portion of said first side of said source substrate.

14. The method of claim 1, further comprising the step of:
   exposing said growth substrate to oxygen plasma, said step of exposing said growth substrate to oxygen plasma being performed after said step of combining said growth substrate with said source substrate and being performed before said step of exposing said substrate stack to said chalcogenide gas.

15. The method of claim 1, wherein, when said step of providing said growth substrate is performed, said growth substrate includes a further layer of a transition metal dichalcogenide on a further portion of said first side of said growth substrate.

16. The method of claim 15, wherein said at least a portion of said first side of said growth substrate intersects said further portion of said first side of said growth substrate.

17. The method of claim 1, wherein said step of exposing said substrate stack to said chalcogenide gas comprises the steps of:
   providing a chalcogenide powder having an evaporation temperature; and
   heating said chalcogenide powder to said evaporation temperature to produce said chalcogenide gas.

18. The method of claim 17, wherein said step of exposing said substrate stack to said chalcogenide gas comprises the steps of:
   providing a furnace, the furnace having an upstream location and a downstream location;
   placing said chalcogenide powder at the upstream location of the furnace;
   placing said substrate stack at the downstream location of the furnace; and
   heating the furnace to said evaporation temperature of said chalcogenide powder, whereby said chalcogenide powder evaporates to produce said chalcogenide gas, and whereby the furnace causes said chalcogenide gas to flow from the upstream location to the downstream location to expose said substrate stack to said chalcogenide gas.

19. The method of claim 1, further comprising:
   depositing a further transition metal oxide on a further portion of said first side of said source substrate, said step of depositing said further transition metal oxide being performed between said steps of depositing said transition metal oxide on said at least a portion of said first side of said source substrate and of combining said growth substrate with said source substrate, whereby, when said substrate stack is exposed to said chalcogenide gas, said further transition metal oxide reacts with said chalcogenide gas to produce a layer of a further transition metal dichalcogenide on a further portion of said growth substrate.

20. The method of claim 1, wherein said layer of said transition metal dichalcogenide is a monolayer.

* * * * *